United States Patent

Wagner

[11] Patent Number: 6,122,037
[45] Date of Patent: Sep. 19, 2000

[54] REFLECTIVE PHASESHIFT LITHOGRAPHY SYSTEM

[75] Inventor: Dietmar Wagner, Fellbach-Oeffingen, Germany

[73] Assignee: International Business Machines Corporation, Armonk, N.Y.

[21] Appl. No.: 09/358,302

[22] Filed: Jul. 21, 1999

[30] Foreign Application Priority Data

Jul. 21, 1998 [DE] Germany ............................ 198 32 691

[51] Int. Cl.⁷ .......................... G03B 27/54; G03B 27/42; G03B 27/72
[52] U.S. Cl. ................................. 355/67; 355/53; 355/71
[58] Field of Search ................................. 355/53, 67, 51, 355/68–71; 430/5, 20, 30; 359/485, 487; 353/34

[56] References Cited

U.S. PATENT DOCUMENTS 5,458,999 10/1995 Szabo et al. ................................. 430/5
5,715,084 2/1998 Takahashi et al. ...................... 359/487

*Primary Examiner*—Eddie C. Lee
*Assistant Examiner*—Hung Henry Nguyen

[57] ABSTRACT

The invention refers to a lithographic device for transferring patterns onto a wafer. The task of the invention is to create a new optical lithographic device with improved resolution and depth of sharpness which will allow semiconductor components to be produced with a higher packing density. According to the invention, an imaging device is used which includes an interferometric device with confocal beam path and a reflection phase shift mask. Based on the achievable resolution and depth of sharpness, the device is suitable for use in DUV step and scan systems for the manufacture of highly integrated semiconductor components. Electron-beam and x-ray lithography only have to be used for smaller grids.

9 Claims, 1 Drawing Sheet

REFLECTIVE PHASESHIFT LITHOGRAPHY SYSTEM

FIELD OF THE INVENTION

The field of the invention is photolithography.

BACKGROUND OF THE INVENTION

The use of lithography for creating very fine patterns is limited by the dependence of the limit of resolution and depth of focus on the illumination wave length. In addition to optical lithography, electron beam and x-ray lithography have therefore been suggested as alternatives because of their shorter wave lengths. However, up-to-date production procedures require very high levels of capital in attempting to extend the use of optical lithography to smaller structures.

In executing a typical photo-lithographic process for a semiconductor device, a mask is used whose pattern is transferred to a wafer. The use of masks which incorporate a phase shifting element (in the following called a phase shift mask) is known in photolithography for reducing the critical dimension while simultaneously improving the resolution. One disadvantage of the prior art phase shift masks is that the lines created do not have sufficiently defined areas at the ends of the lines. In addition, the manufacture of prior art phase shift masks is laborious and costly.

SUMMARY OF THE INVENTION

The invention relates to a lithography system combining an interference technique with a reflection phase shift mask.

An advantageous feature of the invention is that the optical properties are uniform over the reflective mask, so that different types of masks for different configurations (e.g. isolated holes, close lines and spaces, etc.) are not required.

Another advantageous feature of the invention is that the mask need not be transmissive at the wavelength in use.

DESCRIPTION OF THE PREFERRED EMBODIMENT

Figure 1:
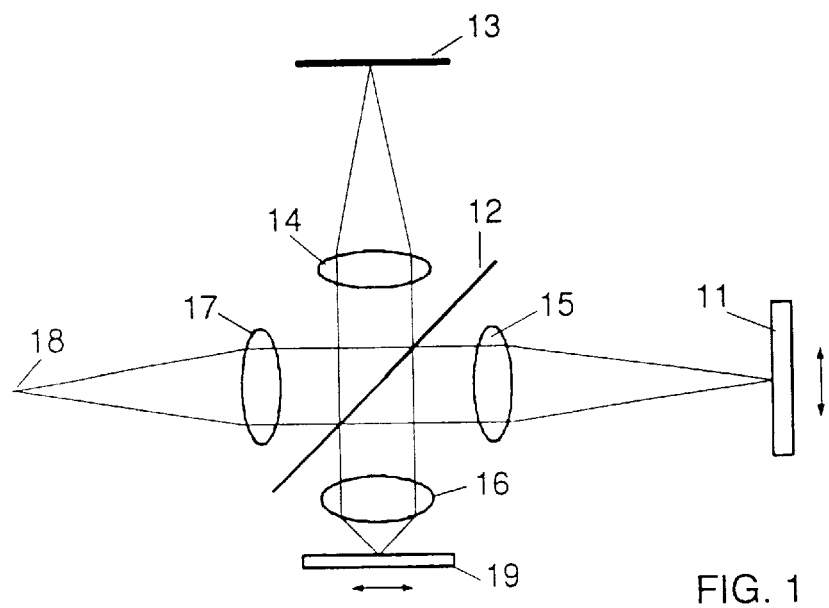
FIG. 1 illustrates a schematic view of a preferred embodiment of the invention.

FIG. 1 shows a preferred embodiment of the invention which includes an interferometric device with a quarter wave phase plate 11 in reflection. A beam emerging from a point light source 18 goes through the lens 17 and hits beam splitter 12. Beam splitter 12 separates the beam which hits it into two beams, the first of which goes through a second lens 14 and falls on a mirror 13, and the second of which goes through a third lens 15 and falls on a reflection phase shift mask 11. Mirror 13 is placed at the focal plane of lens 14 and the reflection phase shift mask 11 is located at the focal plane of lens 15.

Mirror 13 and the reflection phase shift mask 11 are arranged so that the beams which hit them are reflected back to the beam splitter 12 through the lenses 14 and 15. The reflected beams are superimposed by the beam splitter 12 and interfere. The combined beam created in this way passes through objective lens 16 and is focused on to a wafer 19.

The reflective phase shift mask will have two different types of areas—one that reflects normally and one that reflects the incident light with a phase shift. A quarter wave length step (90°) may be used, with the step being either behind or in front of the plane of the normal reflecting surface. Alternatively, a transparent coating that impresses a 90° phase shift may be deposited in the phase shift areas. If, for example, a light source with an illuminating wave length of 250 nm is used, then a reflection phase shift mask with a topography of about 60 nm is required. A material with a low thermal expansion coefficient such as Cerodur® can be used for the mask. An alternative design of the lithographic device can be made with the reflection phase shift mask being designed as a reflecting $n(\lambda/4)$-phase shifting mask where n is an odd integer.

In contrast to standard chrome on glass transmissive phase shift masks, which have at least three types of areas (transmissive, opaque, and phase-shifted) masks according to the invention have only two types of areas—in-phase and out of phase. This permits simpler construction and, in turn, permits the use of more complex layouts because the designer does not have to allow space for phase-shifted areas on the mask and can therefore use the mask area more efficiently.

In operation, a uniform beam (second incident beam) arrives at mask 11 and is: a) reflected at full amplitude with the normal phase shift of Π radians from the reflective areas that represent areas where illumination will reach the wafer (referred to as a first sub-beam of a second return beam); and b) is reflected at full amplitude with a differential phase shift of Π radians (with respect to the radiation in a) above) from the reflective areas where interference at the wafer is desired (referred to as a second sub-beam of the second return beam). For example, the radiation returning from a phase shift area will have a phase shift of Π radians with respect to the radiation from the normally reflective areas. The first and second return beams are combined in beamsplitter 12, under the condition that the relative path lengths for the two beams must be controlled so that the interference is correct; i.e. that the radiation from the normal reflective areas of mask 11 reinforces the radiation from mirror 13 and the radiation from the phase shift areas of mask 11 interferes with the radiation from mirror 13. The foregoing assumes that it is desired that the pattern on the mask results in light of the full intensity striking the wafer (i.e. a negative resist is used). If a positive resist is used, then the radiation representing the mask pattern should arrive Π out of phase with respect to radiation from the mirror and phase-shifted radiation should arrive in phase.

In prior art systems, the phase shift mask is used to cancel the spreading effect of diffraction as the light beam passes through the narrow slits of a transmission mask; i.e. the beam interferes with itself. In the present invention, the primary interference is between the "patterned" beam that has had the circuit pattern impressed on it by reflective mask 11 and the uniform beam from mirror 13.

An excimer laser is preferably used as a light source in the DUV range with an illumination wave length Λ=193 nm. This allows a resolution of 100 nm can readily be achieved. With an illumination wave length of Λ=157 nm, resolutions of 70 nm can be achieved.

With the use of a reflection phase shift mask in the interferometric device, the requirements for the manufacture of a 16 Gbit chip can be fulfilled even at a wavelength of 193 nm and shorter wavelengths (1=157 nm) can be used for the 256 Gbit chip.

In addition, a reflection phase shift mask can be used whose thickness is greatly reduced compared to usual masks and for whose manufacture a range of materials; e.g. transparency at the wavelength is not required. They can therefore be vastly more complex as well as easier to manufacture than usual masks.

The problem which occurs in the pattern imaging of Levinson phase shift masks, of insufficiently defined areas at the line ends, is solved by coding binary mask information in two beams of the same size but with $\Pi/2$ phase offset and superimposing using an auxiliary beam of the same size with a phase offset of 0 or $\Pi/2$ in the interferometer. Thus, in contrast to the prior art, the shape of an element on the reflective mask 11 is reproduced on the wafer and the various shape adjustments on a prior art mask to make the shape on the wafer come out right are not required. Since the optical properties of the mask are uniform over the reflective mask, different types of masks for different configurations (e.g. isolated holes, close lines and spaces, etc.) are not required.

In a preferred design, scanning of the reflection phase shift mask occurs according to the known principle of a scanning stepper. With a fixed mirror 13, the reflection phase shift mask 11 and the wafer must be moved, as usual, in opposition to one another in relation to the imaging scale.

In an additional preferred form, the design of the lithographic device can be carried out so that it is integrated in a DUV step and scan system with structured illumination, e.g. a quadrupole source having four illuminated apertures.

Figure 2:
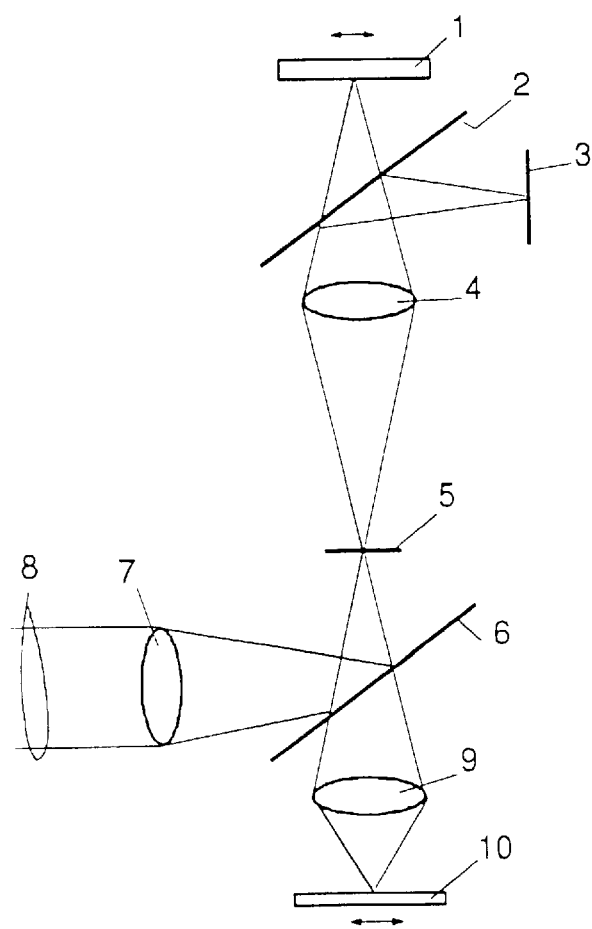
FIG. 2 illustrates a schematic view of an alternative embodiment of the invention presented.

FIG. 2 shows a second embodiment of the invention, which includes an interferometric device with a $\lambda/4$ phase plate in reflection, where the imaging device is combined with a confocal beam path. In this, an illumination system is arranged with a primary lens 7 and a primary beam splitter 6 so that a beam emerging from a light source 8 goes through the lens 7 and is then fed to the lithographic device by means of the beam splitter 6. A shadow mask 5 containing a pinhole aperture is arranged so that it lies in the conjugate plane of a second lens 4. The beam emerging from the beam splitter 6 passes the shadow mask 5 and the lens 4 and hits a second beam splitter 2. In this, the shadow mask 5 works as a point source of light in the confocal beam path. The beam splitter 2 splits the beam which hits it into two coherent beams and is, according to the effective principle of the interference device, arranged so that the first beam hits a mirror 3 and the second beam hits a reflection phase shift mask 1. The reflection phase shift mask 1 is arranged so that it is located in the conjugate plane of the lens 4. The mirror 3 and the reflection phase shift mask 1 are in addition arranged so that beams which hit them are reflected back to beam splitter 2. The reflected beams are superimposed by the beam splitter 2 and interfere. The interference created in this way is imaged onto the shadow mask 5 through lens 4. The function of the shadow mask 5 is that of a "point light detector" in the confocal beam path. The beam emerging through the shadow mask 5 goes through the beam splitter 6 and through an objective lens 9 and is projected onto a wafer 10. In this, the wafer 10 is arranged so that it is located in the conjugated level of the objective lens 9.

While the invention has been described in terms of two embodiments, those skilled in the art will recognize that the invention can be practiced in various versions within the spirit and scope of the following claims.

I claim:

1. An optical system for forming an image of a pattern on a wafer comprising:

a light source for generating an initial optical beam;

a beamsplitter for dividing said initial optical beam into first and second incident beams travelling on first and second beam legs and for combining first and second return beams from said first and second beam legs;

a mirror disposed on a first one of said beam legs and oriented to reflect said first incident beam back toward said beamsplitter as said first return beam;

a reflective surface having said pattern thereon, disposed in a second one of said beam legs, said pattern comprising first and second phase areas formed thereon for impressing said pattern on said second incident beam and for reflecting a patterned beam back toward said beamsplitter as said second return beam, said second return beam comprising first and second sub-beams differing in phase, where a first phase difference between said first return beam and said first sub-beam of said second return beam is substantially $2n\Pi$ radians and a second phase difference between said first return beam and said second sub-beam of said second return beam is $(2n+1)\Pi$ radians, where n is an integer; and a lens disposed to intercept a combined beam formed in said beamsplitter from said first and second return beams, for focusing said combined beam on said wafer, whereby areas of said wafer exposed to said first sub-beam receive radiation of exposing intensity from said first return beam and said first sub-beam and areas exposed to said second sub-beam receive substantially zero radiation, thereby forming an image of said pattern on said wafer.

2. A system according to claim 1, in which n=0.

3. A system according to claim 1, in which light from said light source is collimated by a source lens and said first and second incident beams are both focussed by first and second leg lenses to form an image of said light source on said mirror and on said reflective patterned surface.

4. A system according to claim 1, further comprising first moving means for moving said reflective patterned surface with respect to said second incident beam; and second moving means for moving said wafer with respect to said combined beam, said first and second moving means being adapted to scan said second incident beam and said combined beam in synchronism over said reflective patterned surface and over said wafer.

5. A system according to claim 3, further comprising first moving means for moving said reflective patterned surface with respect to said second incident beam; and second moving means for moving said wafer with respect to said combined beam, said first and second moving means being adapted to scan said second incident beam and said combined beam in synchronism over said reflective patterned surface and over said wafer.

6. A system according to claim 1, in which said reflective patterned surface comprises only said first and second phase areas, whereby a shape of an element on said reflective patterned surface is reproduced in said image on said wafer.

7. A system according to claim 3, in which said reflective patterned surface comprises only said first and second phase areas, whereby a shape of an element on said reflective patterned surface is reproduced in said image on said wafer.

8. A system according to claim 4, in which said reflective patterned surface comprises only said first and second phase areas, whereby a shape of an element on said reflective patterned surface is reproduced in said image on said wafer.

9. A system according to claim 5, in which said reflective patterned surface comprises only said first and second phase areas, whereby a shape of an element on said reflective patterned surface is reproduced in said image on said wafer.

* * * * *